United States Patent
Golbus et al.

(10) Patent No.: US 8,049,531 B2
(45) Date of Patent: Nov. 1, 2011

(54) GENERAL PURPOSE INPUT/OUTPUT SYSTEM AND METHOD

(75) Inventors: Jason Golbus, Campbell, CA (US); Colin N. Murphy, Belmont, CA (US); Alexander D. Taylor, Olga, WA (US)

(73) Assignee: Agate Logic, Inc., Cupertino, CA (US)

( * ) Notice: Subject to any disclaimer, the term of this patent is extended or adjusted under 35 U.S.C. 154(b) by 1054 days.

(21) Appl. No.: 11/855,761

(22) Filed: Sep. 14, 2007

(65) Prior Publication Data

US 2009/0077279 A1    Mar. 19, 2009

(51) Int. Cl.
*H03K 19/177* (2006.01)
*H01L 25/00* (2006.01)

(52) U.S. Cl. .............................. 326/41; 326/39; 326/47

(58) Field of Classification Search ...................... None
See application file for complete search history.

(56) References Cited

U.S. PATENT DOCUMENTS 6,894,530 B1 * 5/2005 Davidson et al. ............... 326/38
7,315,188 B2 * 1/2008 Wang et al. .................... 327/108

* cited by examiner

*Primary Examiner* — Anh Tran
(74) *Attorney, Agent, or Firm* — James M Wu; JW Law Group

(57) ABSTRACT

A system for general purpose input-output (IO), including a first pad; an IO buffer comprising the first pad; and an IO datapath logic block operatively connected to the IO buffer, where the IO datapath logic block and the IO buffer are associated with a general purpose IO block in a heterogeneous configurable integrated circuit (HCIC).

12 Claims, 12 Drawing Sheets

GENERAL PURPOSE INPUT/OUTPUT SYSTEM AND METHOD

CROSS-REFERENCE TO RELATED APPLICATIONS

The present application contains subject matter that may be related to the subject matter in U.S. application Ser. No. 11/855,866 entitled: "Heterogeneous Configurable Integrated Circuit", filed Sep. 14, 2007, and assigned to the assignee of the present invention.

The present application contains subject matter that may be related to the subject matter in U.S. application Ser. No. 11/901,182 entitled: "High-Bandwidth Interconnect Network for an Integrated Circuit", filed on Sep. 14, 2007, and assigned to the assignee of the present application.

The present application also contains subject matter that may be related to the subject matter in U.S. application Ser. No. 11/855,697 entitled: "System and Method for Parsing Frames", filed on Sep. 14, 2007, and assigned to the assignee of the present invention.

The present application also contains subject matter that may be related to the subject matter in U.S. application Ser. No. 11/855,721 entitled: "Reconfigurable Content-Addressable Memory", filed on Sep. 14, 2007, and assigned to the assignee of the present invention.

The present application also contains subject matter that may be related to the subject matter in U.S. application Ser. No. 11/855,740 entitled: "Memory Controller for Heterogeneous Configurable Integrated Circuit", filed on Sep. 14, 2007, and assigned to the assignee of the present invention.

All mentioned U.S. applications are hereby incorporated by reference.

BACKGROUND

Digital systems can be implemented using off-the-shelf integrated circuits. However, system designers can often reduce cost, increase performance, or add capabilities by employing in the system some integrated circuits whose logic functions can be customized. Two common kinds of customizable integrated circuits in digital systems are application-specific integrated circuits (ASICs) and field-programmable gate arrays (FPGAs).

ASICs are designed and manufactured for a particular application. An ASIC includes circuits selected from a library of small logic cells. A typical ASIC also includes large special-purpose blocks that implement widely-used functions, such as a multi-kilobit random-access memory (RAM) or a microprocessor. The logic cells and special-function blocks must be placed at suitable locations on the ASIC and connected by means of wiring.

Application-specific integrated circuits (ASICs) have several advantages. As an ASIC contains only the circuits required for the application, it has a small die size. An ASIC also has low power consumption and high performance. However, ASICs have some disadvantages. It takes a lot of time and money to design ASICs because the design process is complex. Creating prototypes for an ASIC is complex as well so prototyping also takes a lot of time and money.

Field-programmable gate arrays (FPGAs) are another kind of customizable integrated circuit that is common in digital systems. An FPGA is general-purpose device. It is meant to be configured for a particular application by the system designer.

Field-programmable gate arrays (FPGAs) have advantages over application-specific integrated circuits (ASICs). Prototyping an FPGA is a relatively fast and inexpensive process. Also, it takes less time and money to implement a design in an FPGA than to design an ASIC because the FPGA design process has fewer steps.

FPGAs have some disadvantages, the most important being die area. Logic blocks require more area than the equivalent ASIC logic cells, and the switches and configuration memory bits in routing crossbars (XBARs) require far more area than the equivalent wiring of an ASIC. FPGAs also have higher power consumption and lower performance than ASICs.

SUMMARY

In general, in one aspect, the invention relates to a system for general purpose input-output (IO). The system includes a first pad; an IO buffer comprising the first pad; and an IO datapath logic block operatively connected to the IO buffer, where the IO datapath logic block and the IO buffer are associated with a general purpose IO block in a heterogeneous configurable integrated circuit (HCIC).

In general, in one aspect, the invention relates to a system for general purpose input-output (IO). The system includes a plurality of pads an IO buffer comprising at least two of the plurality of pads; an IO datapath logic block operatively connected to the IO buffer; and an error correction code (ECC) unit operatively connected to the IO datapath logic block, wherein the ECC unit, the IO datapath logic block, and the IO buffer are associated with a general purpose IO block in a heterogeneous configurable integrated circuit (HCIC).

In general, in one aspect, the invention relates to a system for termination and impedance control. The system including a plurality of master impedance control registers (MICRs) associated with a plurality of communication modes; a driver operatively connected to a first MICR of the plurality of MICRs, where an impedance of the driver is based on a value of the first MICR; a termination operatively connected to the second MICR of the plurality of MICRs, where an impedance of the termination is based on the value of the second MICR; and an control unit operatively connected to the plurality of MICRs, the driver, and the termination, wherein the control unit is configured to adjust the value of the first MICR to match the impedance of the driver with a first external resistance, and wherein the control unit is configured to adjust the value of the second MICR to match the impedance of the termination with a second external resistance.

Other aspects of the invention will be apparent from the following description and the appended claims.

DETAILED DESCRIPTION

Figure 1:
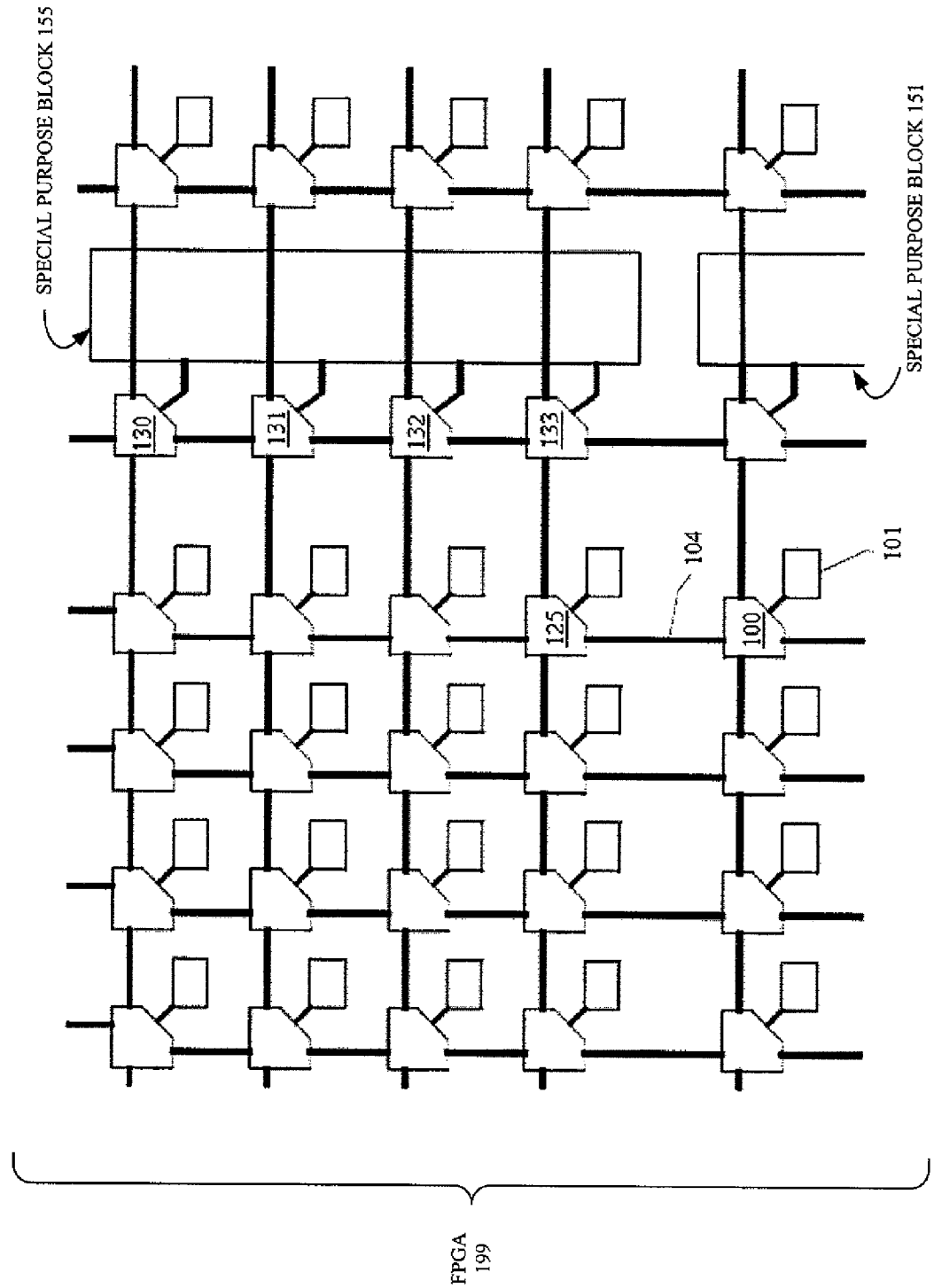
FIG. 1 shows an FPGA in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows an FPGA (199) in accordance with one or more embodiments of the invention. As shown in FIG. 1, the FPGA (199) includes one or more programmable logic blocks (101), one or more configurable special-purpose blocks (151, 155), and one or more routing crossbars (XBARs) (100, 125, 130, 131, 132, 133). Each programmable logic block (101) may include one or more 4-input lookup tables (LUTs) (not shown) and one or more configurable 1-bit sequential cells (not shown). A configurable special-purpose block (151, 155) implements a widely-used function. Those skilled in the art, having the benefit of this detailed description, will appreciate the FPGA (199) may have more than one type of special-purpose block (151, 155).

As also shown in FIG. 1, the routing crossbars (XBARs) (100, 125, 130, 131, 132, 133) form a two-dimensional routing network that provides configurable connections among the logic blocks (101) and the special-purpose blocks (151, 155). Each XBAR may be connected to the nearest-neighbor XBARs in four directions and to either a logic block or a special-purpose block. For example, routing crossbar (125) and routing crossbar (100) are connected by buses (104). Although both logic blocks and special-purpose blocks connect to XBARS, special-purpose blocks are typically much larger than logic blocks and typically have more input and output signals. Accordingly, a special-purpose block may be connected by a plurality of buses to a plurality of XBARs (e.g., special-purpose block (151) is connected to XBARs (130, 131, 132, 133)).

The logic blocks (101), special-purpose blocks (151, 155), and routing crossbars (XBARs) (100, 125, 130, 131, 132, 133) contain configuration memory bits. A user's design is implemented in the FPGA (199) by setting the configuration memory bits appropriately. Several forms of configuration memory are used by contemporary FPGAs, the most common form being static random-access memory (SRAM).

Figure 2:
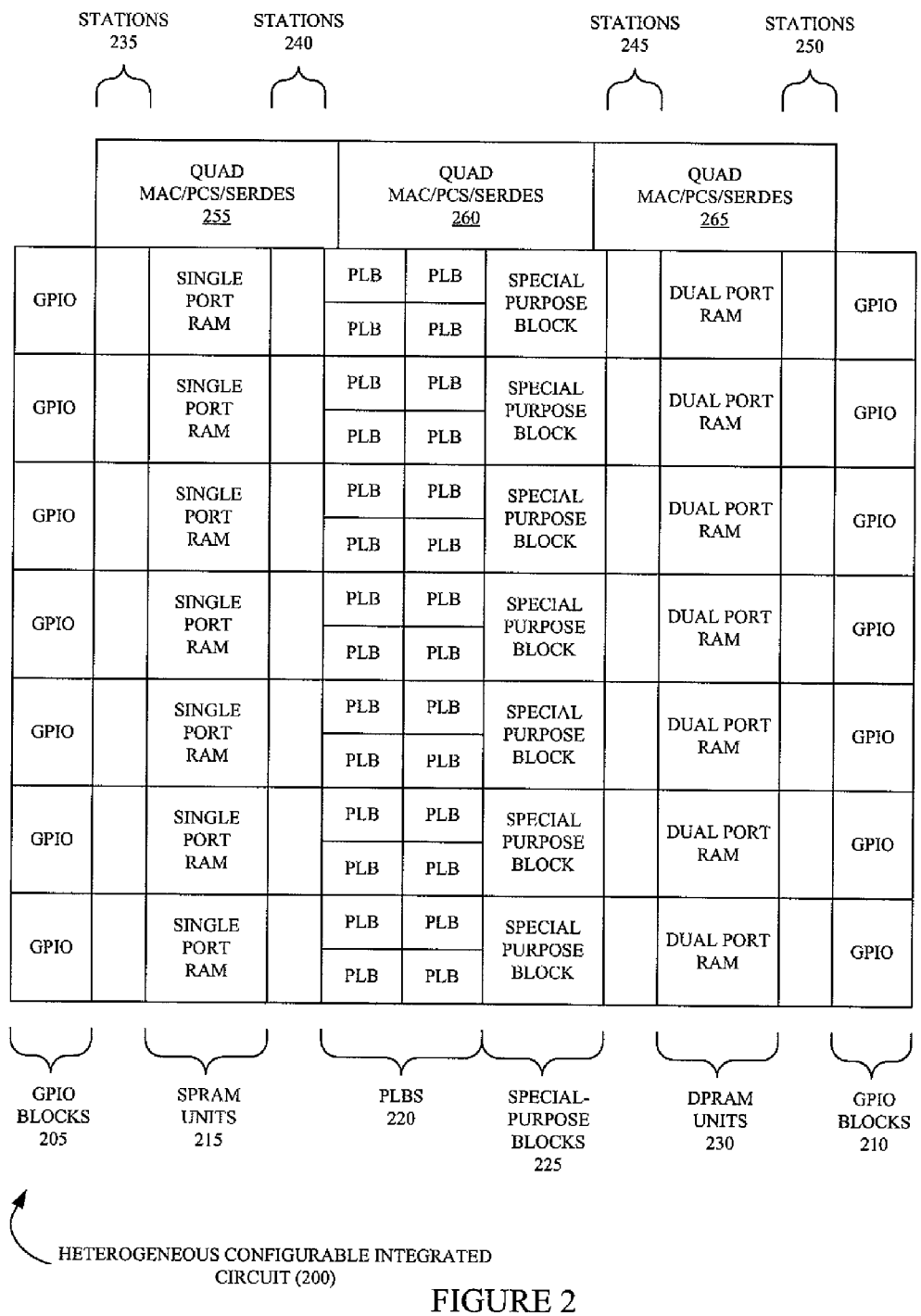
FIG. 2 shows a heterogeneous configurable integrated circuit in accordance with one or more embodiments of the invention.

FIG. 2 shows part of a heterogeneous configurable integrated circuit (HCIC) (200) in accordance with one or more embodiments of the invention. As shown in FIG. 2, the HCIC (200) includes multiple columns of general purpose input/output (GPIO) blocks (205, 210), a column of single port ram units (SPRAM) (215), multiple columns of PLBs (220), a column of special-purpose blocks (225) (e.g., reconfigurable framer parser units, reconfigurable arithmetic units (RAU), reconfigurable content addressable memories (RCAM), memory controllers, etc.), a column of dual port RAM units (DPRAM) (230), multiple columns of stations (235, 240, 245, 250), and multiple quad MAC/PCS/SERDES units (255, 260, 265) bordering the HCIC (200). Those skilled in the art, having the benefit of this detailed description, will appreciate different embodiments of the invention may have a different number of columns for each type of component (e.g., SRAM, special purpose blocks, DRAM, PLBs, etc.).

In one or more embodiments of the invention, the multiple stations (235, 240, 245, 250) form a data cross-connect (DCC) network. This DCC network is a two-dimensional grid of stations that spans the entire HCIC (200). In one or more embodiments of the invention, the DCC network is as described in U.S. application Ser. No. 11/901,182 entitled "High-Bandwidth Interconnect Network for an Integrated Circuit," which was previously incorporated by reference. In one or more embodiments of the invention, the HCIC (200) also includes a routing crossbar network (not shown) in a plane parallel to the DCC network.

Figure 3:
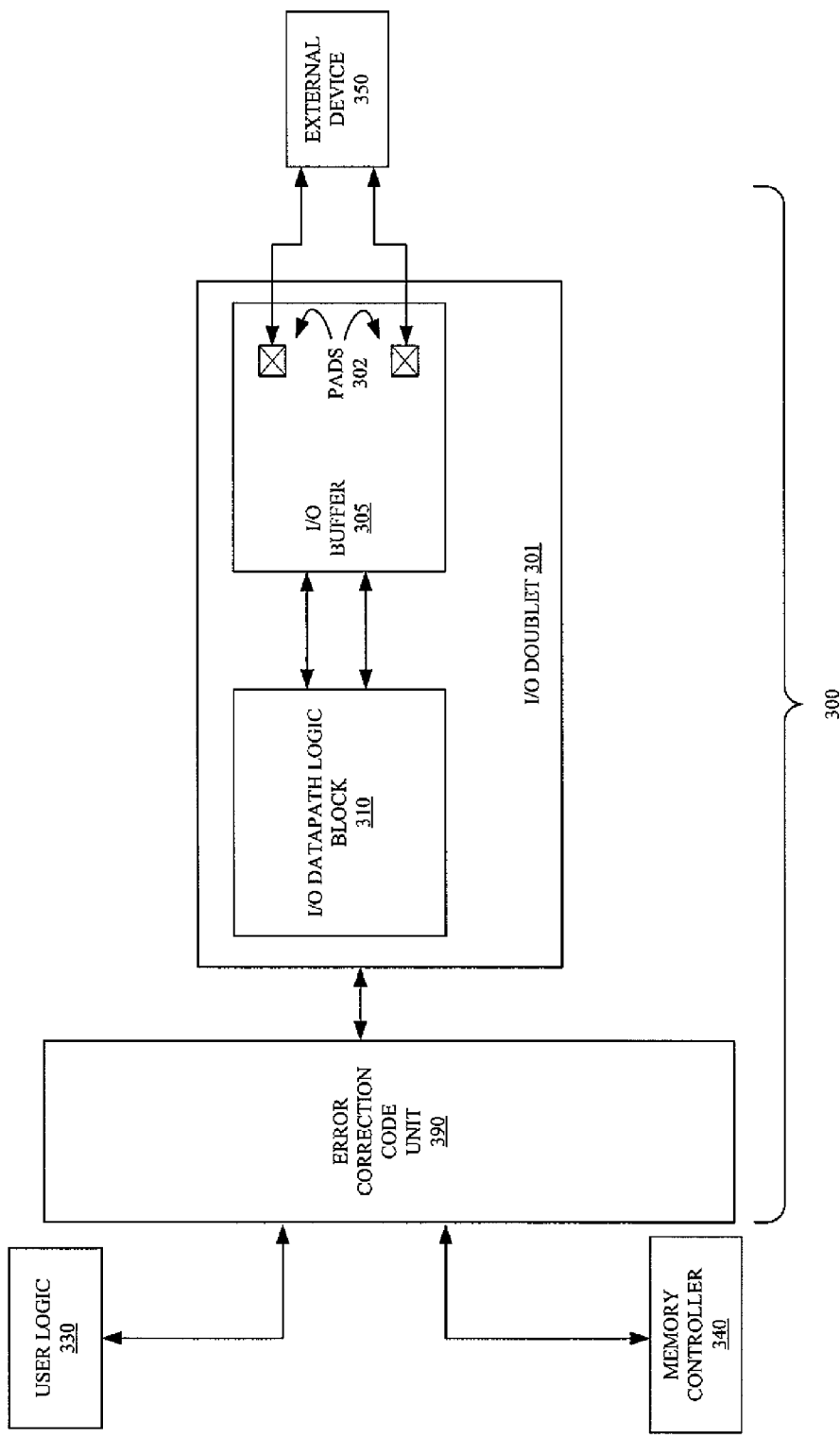
FIG. 3 shows a general purpose input/output (GPIO) block in accordance with one or more embodiments of the invention.

FIG. 3 shows a GPIO block (300) in accordance with one or more embodiments of the invention. As shown in FIG. 3, the GPIO block (300) includes an error correction code (ECC) unit (390) operatively connected to an I/O doublet (301) having an I/O datapath logic block (310) and an I/O buffer (305). In one or more embodiments of the invention, the I/O datapath logic block (310) and the I/O buffer (305) are physically distant from each other.

In one or more embodiments of the invention, the GPIO block (300) operatively connects the HCIC (200) with an external device (350). As shown in FIG. 3, the GPIO block is connected to user logic (330) of the HCIC (200) and/or a memory controller (340) of the HCIC (200) through the DCC network (discussed above). The GPIO block is also connected to the external device (350) through two pads (302) in the I/O buffer (305). Each of these components is discussed below.

In one or more embodiments of the invention, the external device (350) is any device capable of transmitting and/or receiving an electrical signal (e.g., a memory system, a logic device, etc.). The GPIO block (300) enables the transmission of bits arriving from the user logic (330) and/or the memory controller (340) to the external device (350). Similarly, the GPIO block (300) enables the forwarding of bits received from the external device (350) to the user logic (330) and/or the memory controller (340).

The external device (350) may adhere to any architecture including double-data-rate (DDR) architecture, Stub Series Terminated Logic (SSTL), High-Speed Transceiver Logic (HSTL), and Low Voltage Differential Signaling (LVDS). The architecture is a standard that defines the electrical properties (e.g., voltage and current ranges, signal speeds, clocking requirements, timing tolerances, slew rates, impedance requirements, termination requirement, etc.) required to correctly operate the external device (350). Failure to observe one or more electrical properties of the architecture may result in undesirable behavior and/or damage to the external device (350).

In one or more embodiments of the invention, the ECC unit (390) is used to implement an error correcting code. The ECC unit (390) may calculate a set of check bits for a set of data bits arriving from the user logic (330) and/or the memory controller (340). Both the set of check bits and the set of data bits are then transmitted to the external device (350). Similarly, the ECC unit (390) may calculate a set of check bits for a set of data bits received from the external device (350). This calculated set of check bits is compared with a set of check bits received from the external device (350) to detect, and possibly correct, errors in the received set of data bits. The number of check bits and the equations used to generated each check bit are dependent on the type of error correcting code being implemented by the ECC unit (390) (e.g., Hamming code). In one or more embodiments of the invention, the ECC unit (390) extends across multiple I/O doublets (not shown).

Figure 4:
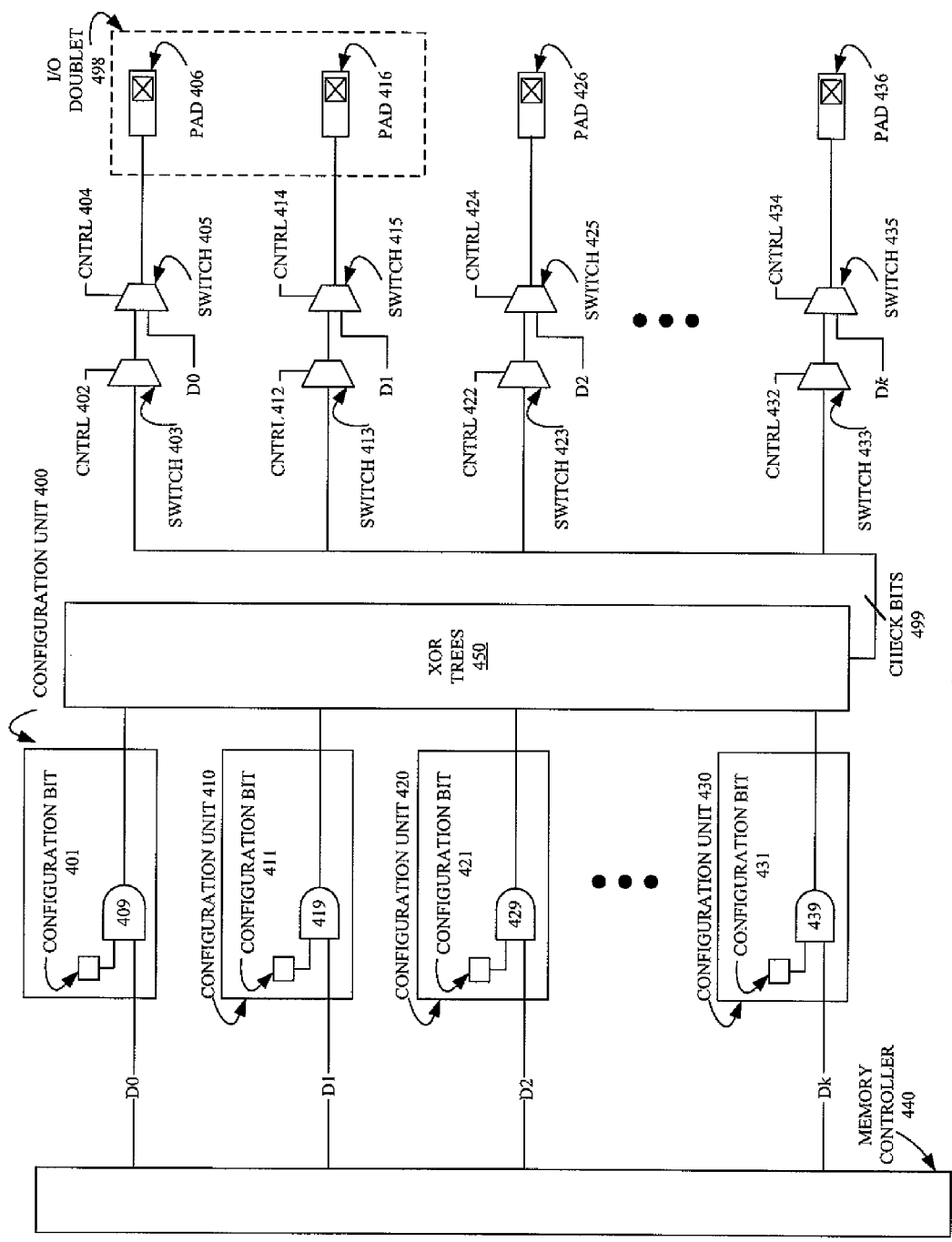
FIG. 4 and FIG. 5 show an error correction code (ECC) unit in accordance with one or more embodiments of the invention.

FIG. 4 shows transmission aspects of an ECC unit in accordance with one or more embodiments of the invention. The ECC unit shown in FIG. 4 may be essentially the same as the ECC unit (390), discussed above in reference to FIG. 3. As shown in FIG. 4, the ECC unit includes multiple exclusive-or (XOR) trees (450) operatively connected to multiple configuration units (400, 410, 420, 430), and multiple switches (403, 413, 423, 433, 405, 415, 425, 435). Pads (406, 416, 426, 436) belonging to I/O doublets (e.g., I/O doublet (498)) are operatively connected to some of the switches. Each of these components is discussed below.

In one or more embodiments of the invention, a set of data bits (D0, D1, D2, . . . , Dk) arriving from the memory controller (440) (or user logic) are input to multiple configuration units (400, 410, 420, 430). Each of the configuration units includes a programmable configuration bit (401, 411, 421, 431) and an AND gate (409, 419, 429, 439) to control input of a data bit to an XOR tree. In one or more embodiments of the invention, there is a configuration unit controlling input of each data bit to each tree. In other words, when there are N XOR trees (450), there are N configuration units for each arriving data bit (one for each XOR tree).

In one or more embodiments of the invention, the XOR trees (450) are configured to calculate a set of check bits (499) from the set of data bits (D0, D1, D2, . . . , Dk). As discussed above, the equation and the data bits required to generate each check bit depend on the error correcting code being implemented. By appropriately programming the configuration bits (401, 411, 421, 431), it is possible to control the inputs (i.e., data bits) to each of the XOR trees (450), and thus control the check bit equation solved by each of the XOR trees (450). In other words, by selectively programming the configuration bits (401, 411, 421, 431), it is possible to control the inputs (i.e., data bits) to each of the XOR trees (450), and thus implement the desired error correcting code.

In one or more embodiments of the invention, a first group of switches (403, 413, 423, 433) input the set of calculated check bits (499) from the XOR trees (450). In other words, the set of check bits (499) is broadcast to the first group of switches (403, 413, 423, 433). Each of the first group of switches (403, 413, 423, 433) may be controlled using the CNTRL signals (402, 412, 422, 432) to select one of the check bits (499) for output.

As also shown in FIG. 4, a second group of switches (405, 415, 425, 435) input both one of the data bits (D0, D1, D2, . . . , Dk) and a check bit (from a switch of the first group). Each of the second group of switches (405, 415, 425, 435) may be controlled using the CNTRL signals (404, 414, 424, 434) to select either the check bit or the data bit for output to a pad (406, 416, 426, 436) (e.g., for transmission to an external device).

Those skilled in the art, having the benefit of this detailed description, will appreciate that as the inputs to the XOR trees (450) are highly configurable (i.e., using configuration units (400, 410, 420, 430)), many different error correcting codes may be implemented by the XOR trees (450).

Those skilled in the art, having the benefit of this detailed description, will appreciate that by specifying the CNTRL signals (402, 404, 412, 414, 422, 424, 432, 434) of the switches (403, 405, 413, 415, 423, 425, 433, 435), the ECC unit has flexibility in selecting the pads (406, 416, 426, 436) for transmitting data bits and the pads (406, 416, 426, 436) for transmitting check bits.

Figure 5:
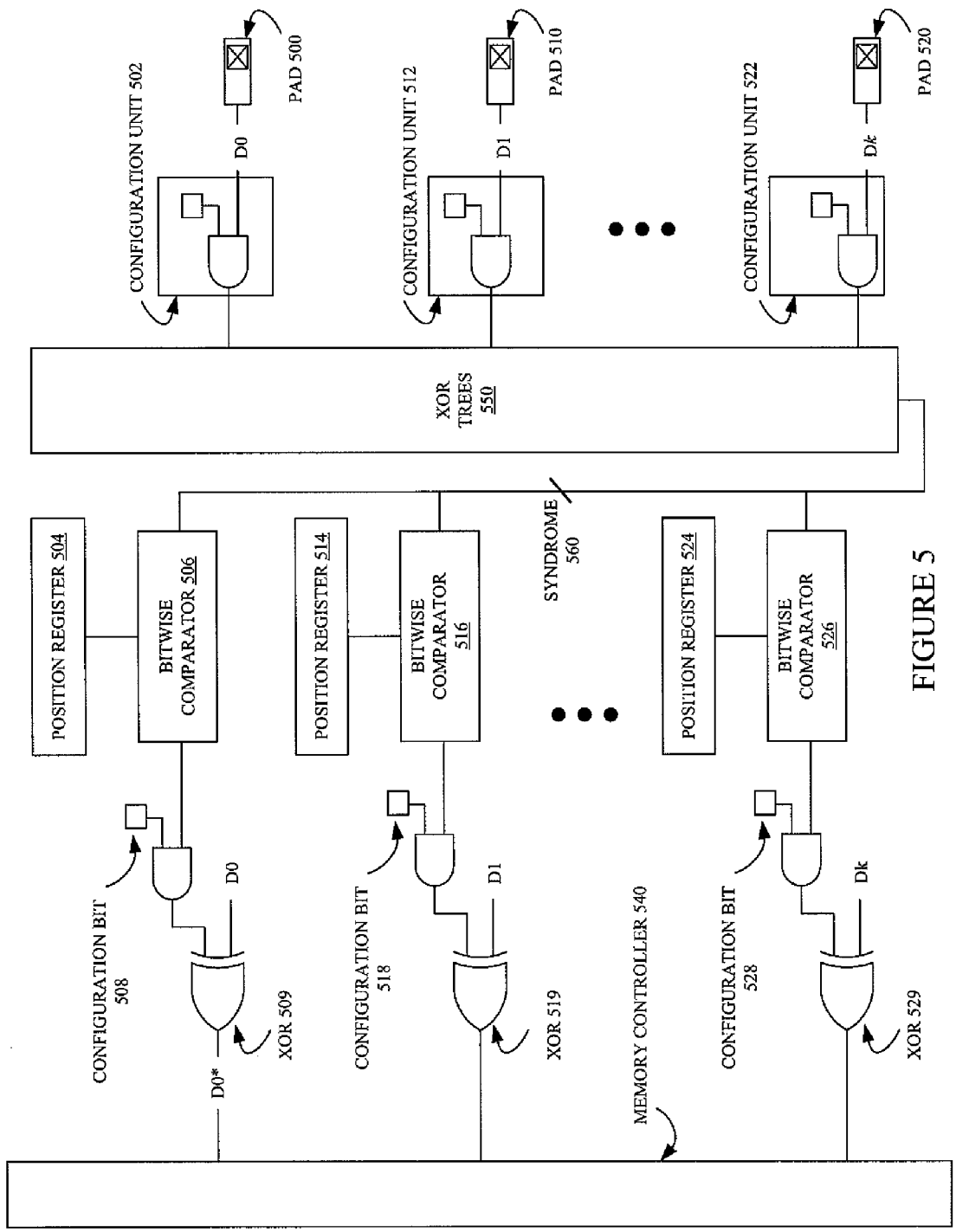

FIG. 5 shows receiving aspects of an ECC unit in accordance with one or more embodiments of the invention. The ECC unit shown in FIG. 5 may be essentially the same as the ECC unit (390), discussed above in reference to FIG. 3. As shown in FIG. 5, the ECC unit includes multiple XOR trees (550) operatively connected to multiple configuration units (502, 512, 522) and multiple bitwise comparators (506, 516, 526). The multiple bitwise comparators (506, 516, 526) are operatively connected to position registers (504, 514, 524) and XOR gates (509, 519, 529). Each of these components is discussed below.

In one or more embodiments of the invention, the data bits (D0, D1, . . . , Dk) and the check bits (not shown) received at the pads (500, 510, 520) are input to multiple configuration units (502, 512, 522). The configuration units (502, 512, 522) are essentially the same as the configuration units discussed above in reference to FIG. 4. Specifically, the configuration units (502, 512, 522) control input of a received data bit (or check bit) to one of the XOR trees (550).

In one or more embodiments of the invention, the multiple XOR trees (550) are configured to calculate check bits based on the received data bits (D0, D1, . . . , Dk). As discussed above, the equation and the data bits (D0, D1, . . . , Dk) required to calculate each check bit depend on the implemented error correcting code. By appropriately programming the configuration units (502, 512, 522), it is possible to control the inputs (i.e., data bits) to each of the XOR trees (550), and thus control the check bit equation solved by each of the XOR trees (550).

In addition, the received check bits (not shown) enter the XOR trees (550) and are XORed with the calculated (i.e., expected) check bits to generate a syndrome (560). The syndrome (560) indicates the position of the flipped received data bit (if any) in the set of received data bits (D0, D1, . . . , Dk). Thus, the syndrome (560) is all zeros if there are no errors. The equations for generating the syndrome (560) depend on the implemented error correcting code. Thus, by appropriately programming the configuration units inputting the check bits (not shown), it is possible to control the inputs (i.e., received check bits, received data bits) to each of the XOR trees (550), and thus control the syndrome equations being solved by the XOR trees (550).

In one or more embodiments of the invention, the generated syndrome (560) is broadcast to multiple bitwise comparators (506, 516, 526). Each of the bitwise comparators (506, 516, 526) are associated with a received data bit (D0, D1, . . . , Dk) and a position register (504, 514, 524) storing the position of said received data bit in the set of received data bits (D0, D1, . . . , Dk). Those skilled in the art, having the benefit of this detailed description, will appreciate that a bitwise comparator (506, 516, 524) will output "true" when the syndrome (560) matches the position stored in the associated position register (504, 514, 524), and thus identify which of the received bits is flipped.

In one or more embodiments of the invention, the XOR gates (509, 519, 540) are operatively connected to the output of the bitwise comparators (506, 516, 526) and the received data bits (D0, D1, . . . , Dk) associated with the bitwise comparators (506, 516, 526). An XOR gate (509, 519, 540) is configured to flip the received data bit when it is determined said received data bit is in error. For example, bitwise comparator (506) is associated with the received data bit (D0). The XOR gate (509) inputs both the result of the bitwise comparator (506) and the received data bit (D0). When it is determined that the received data bit (D0) has been flipped (i.e., D0 was received in error), the XOR gate (509) will flip the received data bit (D0) to a corrected data bit (D0*). The received data bits (D0, D1, . . . , Dk) and/or corrected received data bits may be sent from the ECC unit to the memory controller (540) (or user logic) using the DCC network. Additional signals (not shown) may be sent to the memory controller (540) (or user logic) indicating an error was corrected. The memory controller (540) may be essentially the same as the memory controller (340) discussed above in reference to FIG. 3.

In one or more embodiments of the invention, the ECC unit (390) extends across 64 I/O doublets (i.e., 128 pads) and may contain 8 XOR trees (or 8+8=16 XOR trees in the case of DDR) to support 64+8 ECC.

Those skilled in the art, having the benefit of this detailed description, will appreciate by appropriate programming of the configuration bits (508, 518, 528), the XOR gates (509, 519, 529) may be effectively bypassed (i.e., the data bit is not flipped regardless of the output of the bitwise comparator).

Those skilled in the art, having the benefit of this detailed description, will appreciate that the calculated syndrome (560) may reference a position outside the set of valid data bit positions. In other words, it is possible that none of the bitwise comparators (506, 516, 526) will generate a "true" despite a non-zero syndrome (560). Such scenarios may be an indication that multiple errors are present, but cannot be corrected. In one or more embodiments of the invention, the ECC unit shown in FIG. 5 has additional logic (not shown) inputting the corrected data bits and the syndrome (560) to determine whether multiple errors have been detected yet not corrected. The additional logic (not shown) may output additional signals to the memory controller (540) indicating multiple errors were detected but not corrected.

Figure 6:
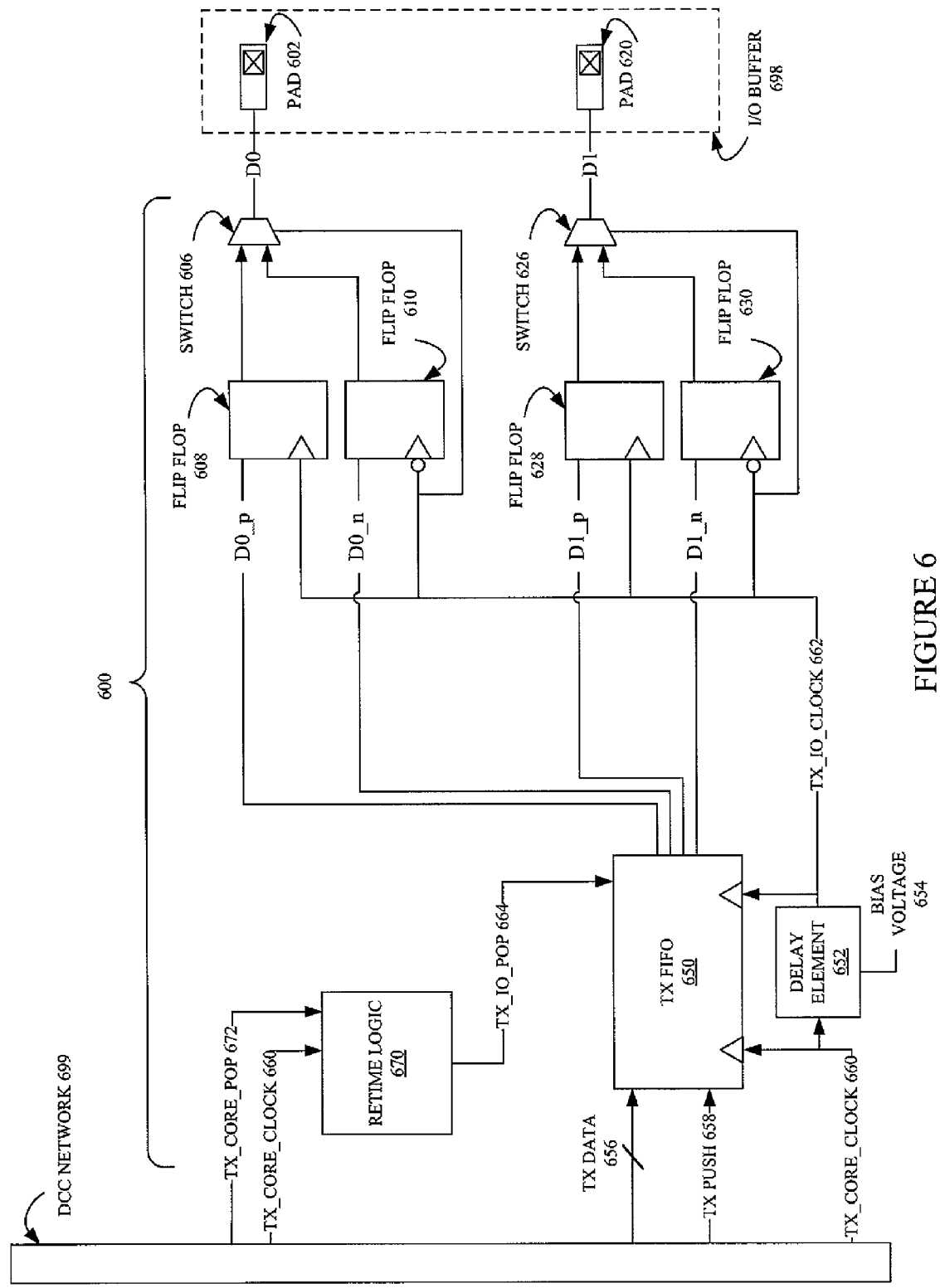
FIG. 6 and FIG. 7 show an I/O datapath logic block in accordance with on or more embodiments of the invention.

Referring back to FIG. 3, the I/O datapath logic block (310) operatively connects the ECC unit (390) and/or the DCC network with the I/O Buffer (305). FIG. 6 shows transmission (TX) aspects of an I/O datapath logic block (600) in accordance with one or more embodiments of the invention. The I/O datapath logic block (600) may be essentially the same as the I/O datapath logic block (310), discussed above in reference to FIG. 3. As shown in FIG. 6, the I/O datapath logic block (600) is operatively connected to both the DCC network (699) and the I/O buffer (698) having two pads (602, 620).

In one or more embodiments of the invention, the I/O datapath logic block (600) includes a TX first-in first-out (FIFO) device (650) operatively connected to multiple flip flops (608, 610, 628, 630). The multiple flip flops (608, 610, 628, 630) are operatively connected to pads (602, 620) of the I/O buffer (698) using multiple switches (606, 626). The I/O datapath logic block (600) also includes a delay element (652) for generating the TX_IO_CLOCK (662) that clocks the multiple flip-flops (608, 610, 628, 630). Each of these components is discussed below.

In one or more embodiments of the invention, the TX FIFO device (650) temporarily stores incoming bits (i.e., TX_DATA (656)) in 4-bit groups (D0_p, D0_n, D1_p, D1_n). Each 4-bit group (i.e., D0_p, D0_n, D1_p, D1_n) is stored in the TX FIFO device (650) at the frequency of TX_CORE_CLOCK (660) and retrieved from the TX FIFO device (650) at the frequency of TX_IO_CLOCK (662). In one or more embodiments of the invention TX_CORE_CLOCK (660) and TX_IO_CLOCK (662) are identical in frequency but differ in phase. In addition, storage to the TX FIFO device (650) is enabled using the TX_PUSH signal (658) and retrieval from the TX FIFO device (650) is enabled using the TX_IO_POP signal (664), generated from the retime logic (670) (discussed below), the TX_CORE_CLOCK (660), and TX_CORE_POP (672). Although FIG. 6 shows the TX_DATA (656) arriving via the DCC network (699), the TX_DATA (656) may alternatively arrive from an ECC unit (i.e., ECC unit (390) discussed above in reference to FIG. 3) or from PLB fabric.

In one or more embodiments of the invention, each 4-bit group (D0_p, D0_n, D1_p, D1_n) stored in the TX FIFO device (650) is moved from the TX FIFO device (650) to the multiple flip flops (608, 610, 628, 630) at the frequency and phase of the TX_IO_CLOCK (662). Specifically, the flip flops (608, 628) input two bits (D0_p, D1_p) of the 4-bit group at the rising edge of the TX_IO_CLOCK (662), while the flip flops (610, 630) input the other two bits (D0_n, D1_n) of the 4-bit group at the falling edge of the TX_IO_CLOCK (662). Using the switches (606, 626), bits are sent to the pads (602, 620) for transmission at both the rising edge and the falling edge of the TX_IO_CLOCK (662). In other words, D0 has the value of D0_p at the rising edge of the TX_IO_CLOCK (662) and D0_n at the falling edge of the TX_IO_CLOCK (662). Similarly, D1 has the value of D1_p at the rising edge of the TX_IO_CLOCK (662) and D1_n at the falling edge of the TX_IO_CLOCK (662). Those skilled in the art, having the benefit of this detailed description, will recognize this configuration as double-data-rate (DDR) architecture.

Although embodiments of the invention have been directed towards using the flip flops (608, 610, 628, 630) to store data bits for transmission, in other embodiments of the invention, the inputs to the flip flops (608, 610, 628, 630) are tied to logic "1" (i.e., D0_p=1, D0_n=0, D1_p=1, D1_n=0). In such embodiments, the pads (602, 620) may be used to transmit a strobe signal or a differential strobe signal (e.g., for an external memory device) on the rising edge and/or falling edge of the TX_IO_CLOCK (662).

As discussed above and shown in FIG. 6, the TX_IO_CLOCK (662) is generated using the delay element (652). In one or more embodiments of the invention, the delay element (652) is a delay line configured by the bias voltage (654). Specifically, the delay element (652) includes multiple taps and the bias voltage (654) is used to align the phase of the input signal (to the first tap) and the phase of the signal leaving the final tap. The delay element (652) inputs the TX_CORE_CLOCK (660), while the TX_IO_CLOCK (662) is an output from a selected tap (not shown) of the delay line.

In one or more embodiments of the invention, the pads (602, 620) are part of a larger set of pads (not shown) all connected to the same external device. As the physical distance between each pad (602, 620) and the external device may not be identical, the bits may arrive at the external device from the multiple pads (602, 620) at slightly different times (i.e., skew). In such embodiments, by appropriately selecting the tap in the delay element (652), it is possible to generate a TX_IO_CLOCK (662) which reduces the skew observed at the external device.

As discussed above, in one or more embodiments of the invention, the pads (602, 620) may be used to transmit strobe signals to the external device (e.g., a memory device). In such embodiments, other pads (not shown) may simultaneously be used to transmit data to the external device. The architecture of the external device may require the strobe signals be 90 degrees out of phase with the transmitted data bits. Accordingly, it may be necessary to select a tap in the delay element (652) generating a TX_IO_CLOCK (662) that is 90 degrees out of phase with the TX_CORE_CLOCK (660), because the TX_CORE_CLOCK (660) is being used by the other pads to transmit data.

Figure 7:
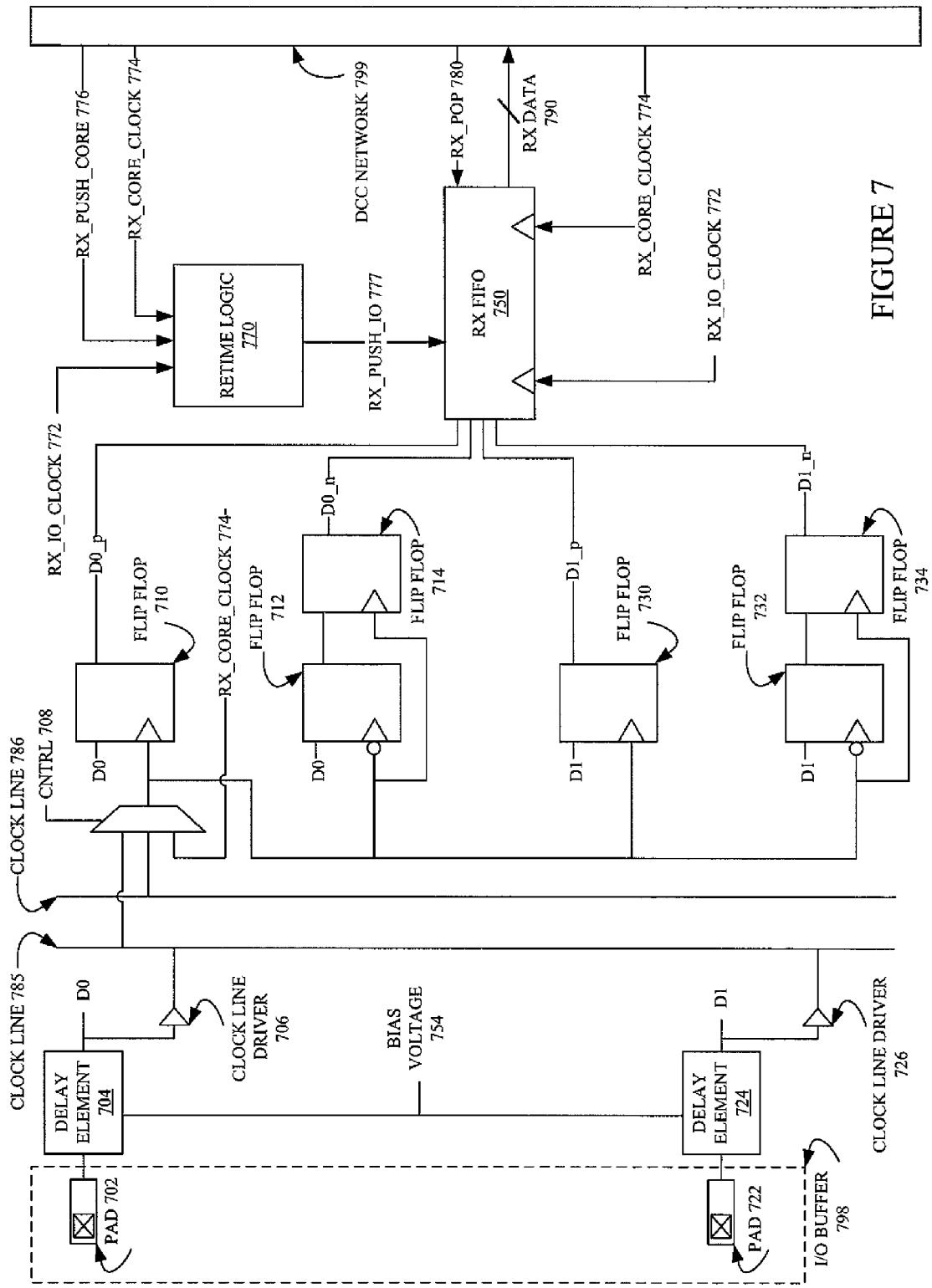

FIG. 7 shows receiving (RX) aspects of an I/O datapath logic block in accordance with one or more embodiments of the invention. The I/O datapath logic block shown in FIG. 7, may be essentially the same as the I/O datapath logic block (310), discussed above in reference to FIG. 3, and is operatively connected to both the DCC network (799) and the I/O buffer (798) having two pads (702, 722).

In one or more embodiments of the invention, the I/O datapath logic block includes multiple flip flops (710, 712, 714, 730, 732, 734) operatively connected to an RX_FIFO device (750) and the pads (702, 720). Each of the flip flops (710, 712, 714, 730, 732, 734) is clocked by one of multiple clock lines (785, 786) or by the RX_CORE_CLOCK (774) arriving via the DCC network (799). The CNTRL signal (708) is used to select the clock signal for clocking the multiple flip-flops (710, 712, 714, 730, 732, 734).

In one or more embodiments of the invention, the flip flops (710, 712, 714, 730, 732, 734) store the bits received by the pads (702, 722) from an external device (not shown). The flip flops (710, 730) store the bits received by the pads (702, 722) during the rising edge of the selected clock, while the flip flops (712, 732) store the bits received by the pads (702, 722) at the falling edge of the selected clock. Using the flip flops (714, 734), a group of 4-bits (D0_p, D0_n, D1_p, D1_n) (i.e., the two bits received during the rising edge and the two bits received during the falling edge) is made available to the RX FIFO device (750). Those skilled in the art, having the benefit of this detailed description, will appreciate D0_p and D0_n represent the values of D0 at the rising and falling edge, respectively, of the selected (i.e., selected using CNTRL (708)) RX_IO_CLOCK (772). Similarly, D1_p and D1_n represent the values of D1 at the rising and falling edge, respectively, of the RS_IO_CLOCK (772).

In one or more embodiments of the invention, the RX FIFO device (750) temporarily stores the group of 4-bits (D0_p, D0_n, D1_p, D1_n). Each 4-bit group is stored in the RX FIFO device (750) at the frequency and phase of the RX_IO_CLOCK (772) and retrieved from the RX FIFO device (750) at the frequency and phase of the RX_CORE_CLOCK (774). The RX_IO_CLOCK (772) is essentially the selected clock signal (i.e. selected using CNTRL (708)) clocking the flip flops (710, 712, 714, 730, 732, 734). In addition, storage to the RX FIFO device (750) is enabled using the RX_PUSH_IO (777) and retrieval from the RX_FIFO device (750) is enabled using the RX_POP (780) received from the DCC network (799). Generation of the RX_PUSH IO (777) from the retime logic (770), the RX_IO_CLOCK (772) and the RX_PUSH_CORE (776) is discussed below. Data retrieved from the RX FIFO device (750) leaves via the DCC network (799) (i.e., RX_DATA (790)). Although FIG. 7 shows the RX_DATA (790) leaving via the DCC network (799), the RX_DATA (790) may alternatively be sent to an ECC unit (i.e., ECC unit (390) discussed above in reference to FIG. 3).

Still referring to FIG. 7, the pads (702, 722) are operatively connected to the clock line (785). The pads (702, 722) may be part of a larger set of pads (not shown) all operatively connected to the clock line (785). In one or more embodiments of the invention, any of the pads (702, 722) operatively connected to the clock line (785) may be used to drive the clock line (785). By enabling one of the clock line drivers (706, 726), the corresponding pad, and the signals received by the corresponding pad (702, 722), are used to drive the clock line (785). The clock line (786) may be essentially the same as the clock line (785) except the clock line (786) may be operatively connected to pads (not shown) far from the pads (702, 722).

In one or more embodiments of the invention, the delay elements (704, 724) are delay lines configured by the bias voltage (754). The bias voltage (754) is tied to the bias voltage (654), discussed above in reference to FIG. 6. The delay elements (704, 724) may be essentially the same as the delay element (652), discussed above in reference to FIG. 6. The delay elements (704, 724) input the signals received by the pads (702, 722) and generated an output (D0, D1) from selected taps (not shown) of the delay lines.

In one or more embodiments of the invention, the pads (702, 722) are part of a larger set of pads (not shown) all connected to the same external device (e.g., a memory device) (not shown). As the physical distance between each pad (702, 722) and the external device may not be identical, the bits may arrive at the pads (702, 722) from the external device (not shown) at slightly different times (i.e., skew). In such embodiments, by appropriately selecting the tap in the delay elements (704, 724), it is possible to reduce the skew.

As discussed above, any one of the pads (702, 722) may be used to drive the clock line (785) by enabling the appropriate clock line driver (706, 726). Accordingly, the signal received at the selected pad (702, 722) drives the clock line (785). In one or more embodiments of the invention, the selected pad (702, 722) may be receiving strobe signals from an external memory device. In such embodiments, depending on the architecture of the external memory device, the incoming strobe signals may be synchronized with the incoming data. Those skilled in the art, having the benefit of this detailed description, will appreciate it may be necessary to delay the received strobe signals driving the clock line (785) (i.e., by 90 degrees) in order for the flips flops (710, 712, 714, 730, 732, 734) to capture the incoming data bits (D0_p, D0_n, D1_p, D1_n) at a clean point in the data eye.

Figure 8:
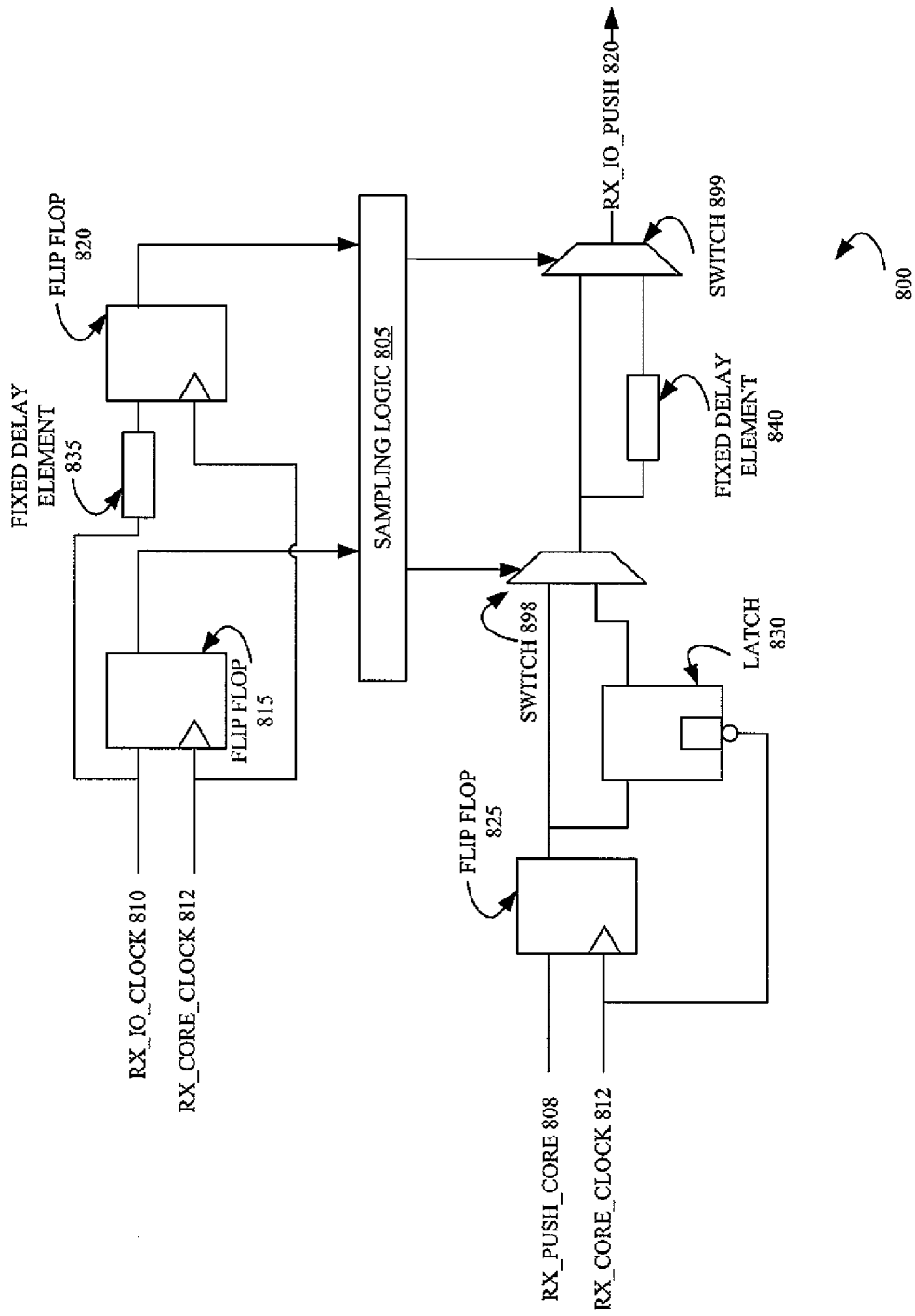
FIG. 8 shows retime logic in accordance with one or more embodiments of the invention.

FIG. 8 shows the retime logic (800) in accordance with one or more embodiments of the invention. The retime logic (800) may be essentially the same as retime logic (770) discussed above in reference to FIG. 7. As shown in FIG. 8, the retime logic (800) includes multiple flip flops (815, 820, 825), a latch (830), multiple fixed delay elements (each with a δ delay) (835, 840), sampling logic (805), and multiple switches (898, 899). The retime logic (800) inputs RX_PUSH_CORE (808), RX_IO_CLOCK (810), and RX_CORE_CLOCK (812), which may be essentially the same as RX_PUSH_CORE (776), RX_IO_CLOCK (772), and RX_CORE_CLOCK (774), respectively, discussed above in reference to FIG. 7. The retime logic (800) outputs RX_IO_PUSH (820), which may be essentially the same as RX_PUSH_IO (777), discussed above in reference to FIG. 7. Those skilled in the art, having the benefit of this detailed description, will appreciate with the fixed delay elements (835, 840), it is possible to generate an RX_IO_PUSH (820) that is 0, δ, 180, or 180+δ degrees out of phase with the RX_PUSH_CORE (808).

In one or more embodiments of the invention, the retime logic (670), discussed above in reference to FIG. 6, is essentially the same as the retime logic (800). However, the retime logic (670) may input TX_CORE_POP (672) instead of RX_PUSH_CORE (808) and TX_CORE_CLOCK (660) instead of RX_CORE_CLOCK (812). Further, the retime logic (670) may output TX_IO_POP (664) instead of RX_IO_PUSH (820). Those skilled in the art, having the benefit of this detailed description, will appreciate with the fixed delay elements (835, 840), it is possible to generate an TX_IO_POP (664) that is 0, δ, 180, or 180+δ degrees out of phase with the TX_CORE_POP (672).

Referring back to FIG. 3, the I/O Buffer (305) operatively connects the I/O datapath logic block (310) with the external device (350) through the pads (302). The I/O Buffer (305)

may be responsible, in part, for converting bits between the electrical requirements (i.e., voltage levels, current levels, source impedances, termination resistances, etc.) of the HCIC (200) and the architectural standard of the external device (350).

Figure 9:
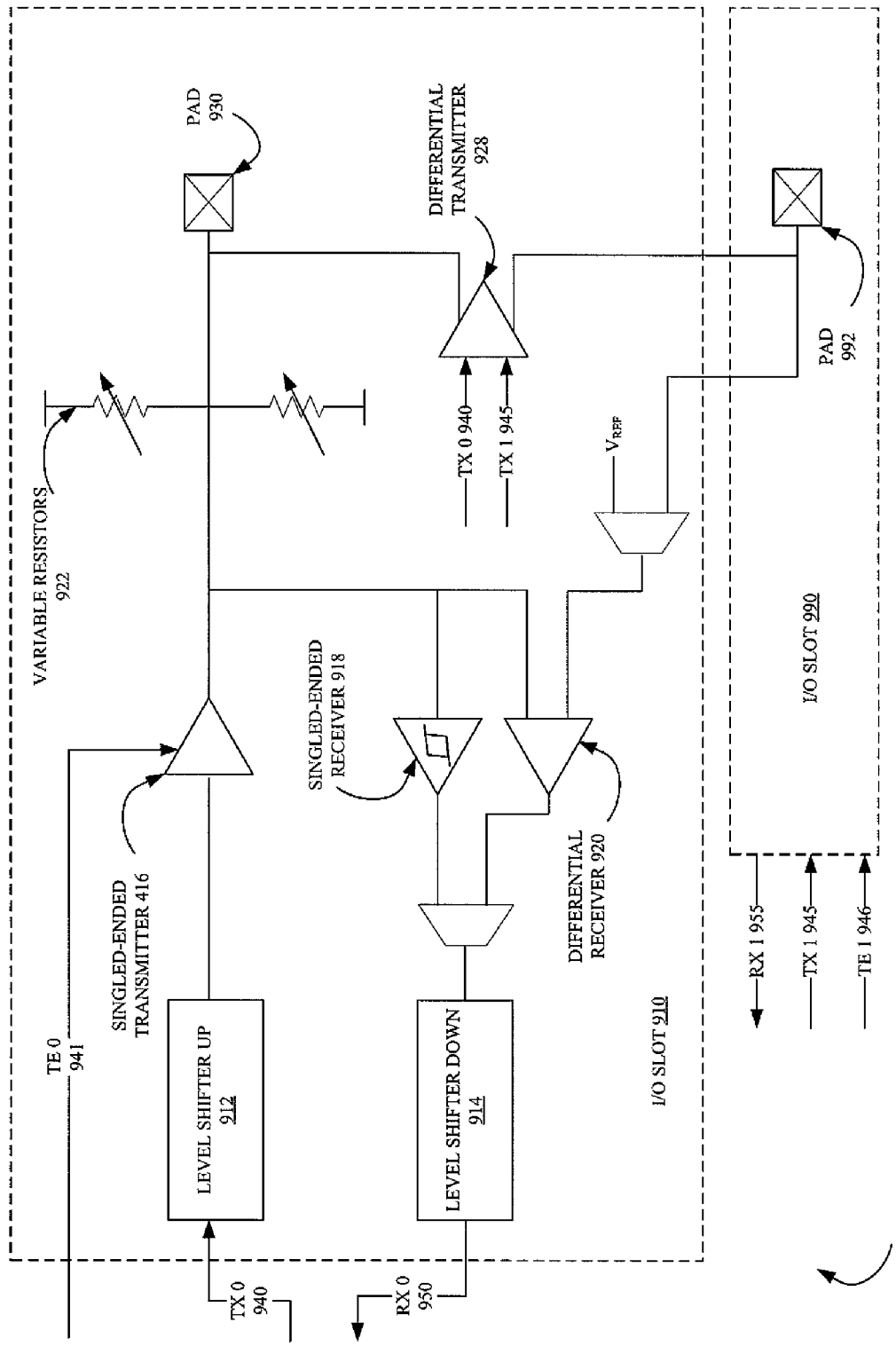
FIG. 9 shows an I/O buffer in accordance with one or more embodiments of the invention.

FIG. 9 shows an I/O buffer (900) in accordance with one or more embodiments of the invention. The I/O buffer (900) may be essentially the same as the I/O buffer (305) discussed above in reference to FIG. 3. The I/O buffer (900) includes two I/O slots (910, 990). As shown in FIG. 9, the I/O slot (910) has multiple components including a pad (992), one or more variable resistors (922), one or more level shifters (i.e., Level Shifter Up (912), Level Shifter Down (914)), one or more receivers (i.e., Single-Ended Receiver (918), Differential Receiver (920)), and one or more transmitters (i.e., Single-Ended Transmitter (916), Differential Transmitter (928)).

As also shown in FIG. 9, the I/O buffer (900) may also include multiple inputs and output signals (i.e., TX 0 (940), TE 0 (941), RX 0 (950), TX 1 (945), TE 1 (946), RX 1 (955)). TX 0 (940) and TX 1 (945) may be essentially the same as D0 and D1, respectively, discussed above in reference to FIG. 6. RX 0 (950) and RX 1 (955) may be essentially the same as D0 and D1, respectively, discussed above in reference to FIG. 7. In one or more embodiments of the invention, the I/O slot (990) is essentially the same as the I/O slot (910) and the differential transmitter (928) requires both I/O slots (910, 990) for operation.

In one or more embodiments of the invention, the one or more variable resistors (922) are used to match the source impedance and/or termination resistance of an external device (e.g., an memory device). The source impedance and/or termination resistance of an external device may be determined by an impedance control block (discussed below). The determined value may be forwarded to I/O buffer (900) for implementation using the one or more variable resistors (922).

In one or more embodiments of the invention, when in receiving mode, the I/O slot (910) uses either the single-ended receiver (918) or the differential receiver (920). The single-ended receiver (918) may use a Schmitt trigger. The differential receiver (920) may be configured to compare a received signal (i.e., from the PAD (930)) against a reference signal (VEF). The differential receiver (920) may be configured to compare a received signal against an input signal from an adjacent I/O slot (i.e., the PAD (992) in the I/O Slot (990)). The selection of receiver type and/or the operating mode of the receiver may be based on the architecture of the external device transmitting data to the I/O doublet. In one or more embodiments of the invention, the received data passes through a level shifter (i.e., Level Shifter Down (914)) to adjust logical values before leaving the I/O slot (910) as RX 0 (950).

In one or more embodiments of the invention, when in transmitting mode, the I/O Slot (910) uses either the single-ended transmitter (916) or the differential transmitter (928). Those skilled in the art, having the benefit of this detailed description, will appreciate that when using the differential transmitter (928) both pads (930, 992) may be required. In other words, the differential transmitter (928) may be shared between both I/O slots (910, 990). The selection of the transmitter type may be based on the architecture of the external device receiving data from the I/O doublet. In one or more embodiments of the invention, data to be transmitted arrives via TX 0 (940) and is passed through a level shifter (i.e., Level Shifter Up (912)) to adjust logical values prior to transmission.

In one or more embodiments of the invention, TE 0 (941) is used to enable or disconnect the single-ended transmitter (916). In other words, the single-ended transmitter (916) may operate based on tri-state logic. Those skilled in the art, having the benefit of this disclosure, will appreciate the same I/O slot may be used to transmit or receive as controlled by the tri-state logic. TE 1 (945) may be essentially the same as TE 0 (941), except TE 0 (941) is associated with a single-ended transmitter (16) in I/O slot 1 (490) (not shown). Both TE 0 (941) and TE 1 (945) may be generated by an I/O datapath logic block (e.g., I/O datapath logic block (310), discussed above in reference to FIG. 3).

TE 1 (945) may be associated with a single-ended transmitter in I/O slot (990) (not shown). Those skilled in the art, having the benefit of this detailed description, will appreciate through the appropriate selection of signals and components, the I/O buffer (900) may be configured as a single-ended input buffer; a single-ended output buffer; a single-ended, tri-state, output buffer; a bidirectional, input/output buffer; a $V_{REF}$ referenced, single-ended input buffer; a $V_{REF}$ referenced, single-ended, bidirectional, input/output buffer; a differential input buffer; a differential output buffer; a differential, tri-state output buffer; or a differential bi-directional, input/output buffer.

Figure 10:
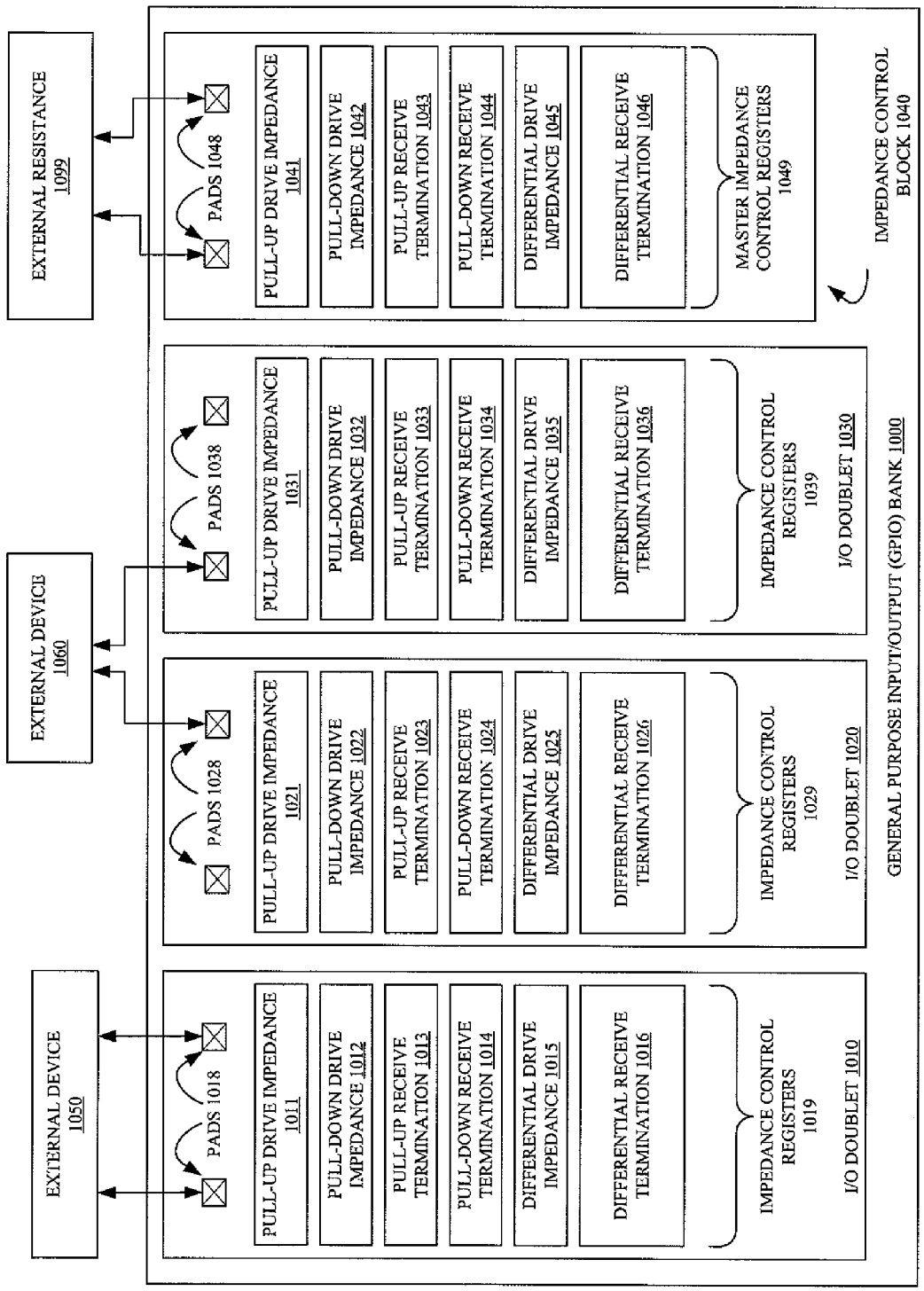
FIG. 10 shows a GPIO bank in accordance with one or more embodiments of the invention.

FIG. 10 shows a general GPIO bank (1000) in accordance with one or more embodiments of the invention. The GPIO bank (1000) may be located along a perimeter of the HCIC (200). As shown in FIG. 10, the GPIO bank (1000) has several components including multiple I/O doublets (1010, 1020, 1030) and an impedance control block (1040). Although embodiments of the invention have been directed towards a GPIO bank (1000) with three I/O doublets, those skilled in the art, having the benefit of this detailed description, will appreciate that the GPIO bank (1000) may have any number of I/O doublets (e.g., 8 or 24 I/O doublets).

In one or more embodiments of the invention, each of the I/O doublets (1010, 1020, 1030) includes impedance control registers (1019, 1029, 1039). The impedance and/or termination measured at the pads (1018, 1028, 1038) is controlled by the values stored in the impedance control registers (1019, 1029, 1039). Further, each register of the impedance control registers (1019, 1029, 1039) may correspond to a communication mode (i.e., single-ended transmit mode, single-ended receive mode, differential transmit mode, differential receive mode) of the I/O doublets (1010, 1020, 1030).

For example, when the I/O doublet (1010) is operating in single-ended transmit mode, the impedance measured at each of the pads (1018) is controlled by values in the pull-up drive impedance register (1011) and/or the pull-down drive impedance register (1012). When the I/O doublet (1010) is operating in single-ended receive mode, the termination measured at each of the pads (1018) is controlled by values in the pull-up receive termination register (1013) and/or the pull-down receive termination register (1014). When the I/O doublet (1010) is operating in differential transmit mode, the impedance measured across the pads (1018) is controlled by the value in the differential drive impedance register (1015). When the I/O doublet (1010) is operating in differential receive mode, the termination measured across the pads (1018) is controlled by the differential receive termination register (1016).

In one or more embodiments of the invention, the impedance control block (1040) includes the master impedance control registers (1049) and pads (1048) connected to an external resistance (1099). The impedance control block (1040) has additional control logic (not shown) to compare the impedance and/or termination at the pads (1048) with the external resistance (1099), under different operating modes (i.e., single-ended transmit mode, differential receive mode, etc.). In one or more embodiments of the invention, the impedance control block (1040) is configured to change the values in the master impedance control registers (1049) until the impedance and/or termination at the pads (1048) matches the external resistance (1099) under one or more of the communication modes.

In one or more embodiments of the invention, the values in the impedance control registers (1019, 1029, 1039) are scaled versions of the values in the master impedance control registers (1049). For example, the values in the pull-up drive impedance registers (1011, 1021, 1031) may be scaled versions of the value in pull-up drive impedance register (1041). The values in the pull-down drive impedance registers (1012, 1022, 1032) may be scaled versions of the value in the pull-down drive impedance register (1042). The values in the pull-up receive termination registers (1013, 1023, 1033) may be scaled versions of the value in the pull-up receive termination register (1043). The values in the pull-down receive termination registers (1014, 1024, 1034) may be scaled versions of the value in the pull-down receive termination register (1044). The values in the differential drive impedance registers (1015, 1025, 1035) may be scaled versions of the value in the differential drive impedance register (1045). The values in the differential receive termination registers (1016, 1026, 1036) may be scaled versions of the value in the differential receive termination register (1046).

In one or more embodiments of the invention, the scaling is based on a ratio of the external resistance (1099) to the impedance and/or termination of an external device (1050, 1060). Those skilled in the art, having the benefit of this detailed description, will appreciate that by determining the values in the master impedance control registers (1049) that match the impedance and/or termination of the pads (1048) to the external resistance (1099), and by knowing the ratio of the external resistance (1099) to the impedance and/or termination of the external device (1050), the appropriate values for the impedance control registers (1019) may be determined so that the impedance and/or termination of the pads (1018) are matched to the impedance and/or termination of the external device (1050).

In one or more embodiments of the invention, the values in the master impedance control registers (1049) and the impedance control registers (1019, 1029, 1039) are updated at scheduled intervals and/or following a change in the operating conditions (e.g., temperature change). During the updating process, the impedance control block (1040) may sequentially evaluate and adjust the values in the master impedance control registers (1049) for each of the six different impedances/terminations (i.e., pull-up driver, pull-down driver, pull-up termination, pull-down termination, differential driver, differential termination). In other words, the impedance control block (1040) may independently update each of the master impedance control registers (1049) one after the other.

Figure 11A:
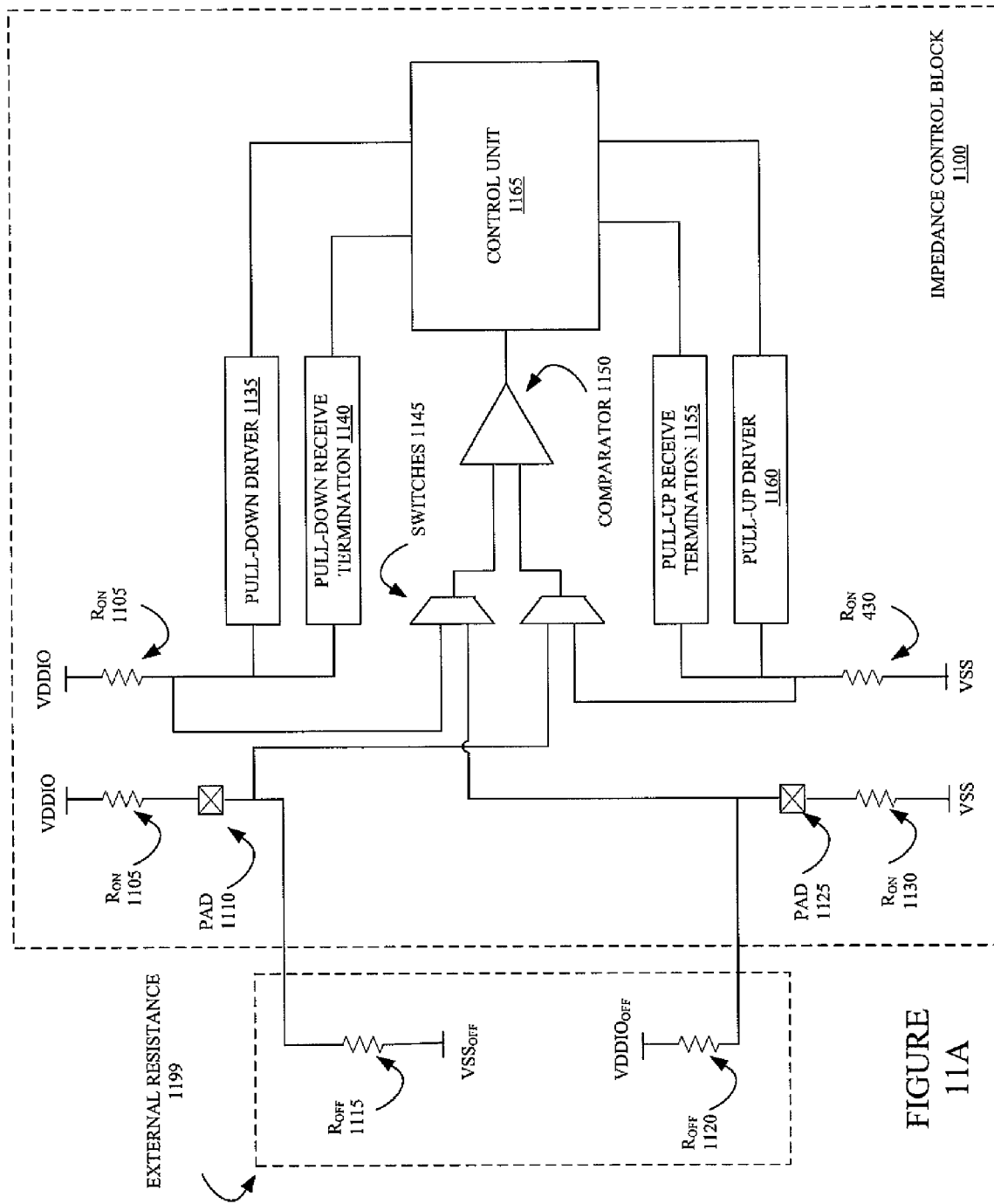
FIG. 11A and FIG. 11B show an impedance control block in accordance with one or more embodiments of the invention.

FIG. 11A shows an impedance control block (1100) in accordance with one or more embodiments of the invention. The impedance control block (1100) may be essentially the same as the impedance control block (1040), discussed above in reference to FIG. 10. As shown in FIG. 11A, the impedance control block (1100) has numerous components including multiple pads (1125, 1110), multiple on-board resistors (i.e., $R_{ON}$ (1105), $R_{ON}$ (1130)), switches (1145), a comparator (1150), a control unit (1165), multiple terminations (i.e., pull-down receive termination (1140), a pull-up receive termination (1155)), and multiple impedances (i.e., pull-down driver (1135), pull-up driver (1160)). The multiple terminations and impedance each correspond to a different operating mode.

In one or more embodiments of the invention, the pads (1125, 1110) are connected to the external resistance (1199). The external resistance (1199) has numerous components including multiple resistors (i.e., $R_{OFF}$ (1120), $R_{OFF}$ (1115)). The pads (1125, 1110) and the external resistance (1199) may be essentially the same as the pads (1048) and external resistance (1099), respectively, discussed above in reference to FIG. 10.

Those skilled in the art, having the benefit of this detailed description, will appreciate that the configuration shown in FIG. 11A may be used for matching the pull-down driver (1135) and/or the pull-down receive termination (1140) with $R_{OFF}$ (1115). Similarly, those skilled in the art, having the benefit of this detailed description, will appreciate that the configuration shown in FIG. 4A may be used for matching the pull-up receive termination (1155) and the pull-up driver (1160) with $R_{OFF}$ (1120).

In one or more embodiments of the invention, the pull-down driver (1135), the pull-down receive termination (1140), the pull-up receive termination (1155), and the pull-up driver (1160) are controlled by master impedance control registers (i.e., the master impedance control registers (1049) as shown in FIG. 10) in the control unit (1165). Using input from the switches (1145) and the comparator (1150), the control unit (1165) may be configured to determine when matches between the $R_{OFF}$ (1115) and the pull-down driver (1135) and/or the pull-down receive termination (1140) exist. Similarly, using the input from the switches (1145) and the comparator (1150), the control unit (1165) may be configured to determine when matches between the $R_{OFF}$ (1120) and the pull-up receive termination (1155) and/or the pull-up driver (1160) exist. In one or more embodiments of the invention, when a match does not exist, the control unit (1165) is configured to adjust one or more of the master impedance control registers, and thus change one or more of the impedances (1135, 1160) and/or terminations (1140, 1155) until a match exists.

Figure 11B:
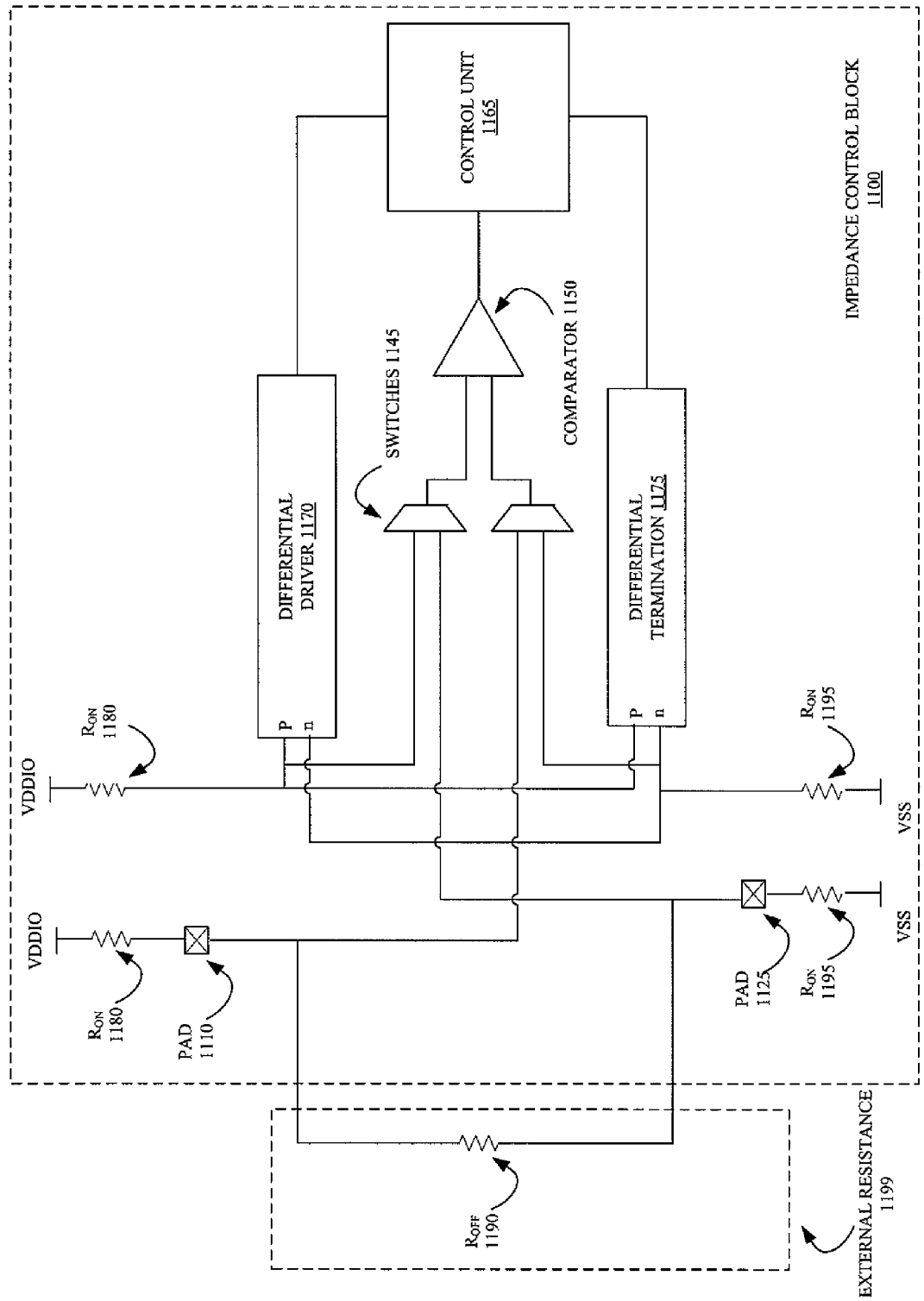

FIG. 11B shows an impedance control block (1100) in accordance with one or more embodiments of the invention. The impedance control block (1100) may be essentially the same as the impedance control block (1040), discussed above in reference to FIG. 10. As shown in FIG. 1B, the impedance control block (1100) has numerous components including multiple pads (1110, 1125), multiple on-board resistors (i.e., $R_{ON}$ (1180), $R_{ON}$ (1195)), switches (1145), a comparator (1150), a control unit (1165), a differential driver (1170), and a differential termination (1175). The differential termination (1175) and the differential driver (1170) correspond to different operating modes.

In one or more embodiments of the invention, the pads (1125, 1110) are connected to the external resistance (1199). The external resistance includes a resistor (i.e., $R_{OFF}$ (1190)) connected to both pads (1110, 1125). The pads (1125, 1110) and the external resistance (199) may be essentially the same as the pads (1048) and external resistance (1099), respectively, discussed above in reference to FIG. 10.

Those skilled in the art, having the benefit of this detailed description, will appreciate that the configuration shown in FIG. 11B may be used for matching the differential driver (1170) with $R_{OFF}$ (1190). Similarly, those skilled in the art, having the benefit of this detailed description, will appreciate that the configuration shown in FIG. 11B may be used for matching the differential termination (1175) with $R_{OFF}$ (1190).

In one or more embodiments of the invention, the differential driver (1170) and the differential termination (1175) are controlled by master impedance control registers (i.e., the master impedance control registers (1049), as shown in FIG. 10) in the control unit (1165). Using input from the switches (1145) and the comparator (1150), the control unit (1165) may be configured to determine when a match between the $R_{OFF}$ (1190) and the differential driver (1170) exists. Similarly, using the input from the switches (1145) and the comparator (1150), the control unit (1165) may be configured to determine when a match between the $R_{OFF}$ (1190) and the differential termination (1175) exists. In one or more embodiments of the invention, when a match does not exist, the control unit (1165) is configured to adjust one or more of the master impedance control registers, and thus change one or more of the impedances until a match with $R_{OFF}$ (1190) exists.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for general purpose input-output (IO), comprising:
   a first pad;
   an IO buffer comprising the first pad;
   an IO datapath logic block operatively connected to the IO buffer, wherein the IO datapath logic block and the IO buffer are associated with a general purpose IO block in a heterogeneous configurable integrated circuit (HCIC);
   a memory controller associated with the HCIC operatively connected to the IO datapath logic block using a data cross-connect network; and
   an external device operatively connected to the first pad, wherein data is exchanged between the external device and the memory controller using the general purpose IO block.

2. The system of claim 1, wherein the IO datapath logic block comprises:
   a first-in first-out (FIFO) device configured to input a first data bit and a second data bit based on a frequency of a core clock and a push signal, wherein the FIFO device is further configured to output the first data bit and the second data bit based on a frequency of an IO clock and an IO pop signal;
   a first flip flop clocked by a rising edge of the IO clock and operatively connected to the FIFO device to input the first data bit;
   a second flip flop clocked by a falling edge of the IO clock and operatively connected to the FIFO device to input the second data bit; and
   a switch inputting an output of the first flip flop and an output of the second flip flop, wherein the switch is controlled by the IO clock, wherein the first pad is operatively connected to the switch, and wherein the first pad transmits the first data bit and the second data bit in a cycle of the IO clock.

3. The system of claim 2, wherein the IO pop signal is generated from retime logic using a core pop signal, and the core clock, wherein IO pop signal and the core pop signal are out of phase.

4. The system of claim 2, wherein the IO datapath logic block further comprises retime logic configured to generate the IO pop signal using the IO clock, the core clock, a core pop signal, a latch inputting the core clock, and a fixed delay element.

5. The system of claim 2, wherein the IO datapath logic block further comprises a delay element to generate the IO clock by delaying the core clock, wherein the delay elements inputs a bias voltage.

6. A system of claim 1, wherein the IO datapath logic block comprises:
   a delay element in putting a bias voltage and configured to generate an IO clock by delaying a core clock;
   a first flip flop clocked by a rising edge of the IO clock; and
   a second flip flop clocked by a falling edge of the IO clock, wherein the first pad is operatively connected to an output of the first flip flop and an output of the second flip flop, and wherein the first pad is configured to transmit a strobe signal based on the IO clock.

7. The system of claim 1, wherein the IO datapath logic block comprises:
   a first delay element operatively connecting the first pad to an IO clock line, wherein the first pad is selected to drive the IO clock line by activating a clock line driver associated with the first pad;
   a first flip flop clocked by a rising edge of the IO clock line;
   a second flip flop clocked by a falling edge of the IO clock line;
   a second delay element operatively connecting a second pad to an input of the first flip flop and an input of the second flip flop, wherein the first flip flop stores a first data bit received by the second pad and the second flip flop stores a second data bit received by the second pad.

8. The system of claim 7, wherein the first delay element delays a signal received by the first pad by 90 degrees.

9. The system of claim 7, wherein the IO datapath logic block further comprises:
   a first-in first-out (FIFO) device operatively connected to the first flip flop and the second flip flop, wherein the FIFO device inputs the first data bit and the second data bit based on the IO clock line and an input-output (IO) push signal, and wherein the FIFO device outputs the first data bit and the second data bit based on a core clock and a pop signal.

10. The system of claim 7, wherein the second delay element is configured to compensate for skew between data bits arriving at the HCIC.

11. The system of claim 9, wherein the IO push signal is generated from retime logic using a core push signal, the core clock, and the IO clock line, wherein the push signal and the core push signal are out of phase.

12. The system of claim 9, wherein the IO datapath logic block further comprises retime logic configured to generate the IO push signal using a sample of the IO clock line, a core push signal, a latch inputting the core clock, and a fixed delay element.

* * * * *